(12) United States Patent  
Nakamura et al.

(10) Patent No.: US 6,654,257 B2
(45) Date of Patent: Nov. 25, 2003

(54) NOISE PROTECTION SHEET

(75) Inventors: Satoshi Nakamura, Kyoto (JP); Mitsunori Nagashima, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 09/805,934

(22) Filed: Mar. 15, 2001

(65) Prior Publication Data

US 2002/0126464 A1 Sep. 12, 2002

(30) Foreign Application Priority Data

Mar. 15, 2000 (JP) .......................... P.2000-71634

(51) Int. Cl.[7] ................................. H05K 9/00
(52) U.S. Cl. ................. 361/818; 361/800; 361/816; 174/35 R
(58) Field of Search ................. 361/800–807, 361/810, 816, 818; 174/51, 52.1–52.4, 35 R, 35 MS, 35 TS; 219/209; 165/185

(56) References Cited

U.S. PATENT DOCUMENTS

| 4,999,741 A | * | 3/1991 | Tyler | 165/185 |
| 5,358,684 A | * | 10/1994 | Valentin | 419/10 |
| 5,508,888 A | * | 4/1996 | Craps | 174/52.4 |
| 5,968,386 A | * | 10/1999 | Goenka et al. | 219/209 |

* cited by examiner

Primary Examiner—David L. Talbott
Assistant Examiner—Tuan Dinh
(74) Attorney, Agent, or Firm—Morgan, Lewis & Bockius LLP

(57) ABSTRACT

A noise protection sheet 1 is stuck on an IC chip C loaded on a circuit board 31 to control the noise generated from the IC chip C. The noise protection sheet 1 includes a metallic sheet 2 and insulating films 3 sandwiching the metallic sheet from both front and rear surfaces thereof. The metallic sheet 2 has, at its one end, an extending portion 7 to be connected to a land 32 serving as a grounding terminal on the circuit board 31. In this configuration, the noise protection sheet can effectively solve a noise problem in an electronic component.

4 Claims, 6 Drawing Sheets

NOISE PROTECTION SHEET

BACKGROUND OF THE INVENTION

1. Field of the Invention

This invention relates to a noise protection sheet which is stuck on an electronic component mounted on a circuit board and serves to suppress the noise generated from the electronic component, its mounting apparatus and its mounting method.

2. Description of the Related Art

Traditionally, an electronic appliance such a personal computer, a portable telephone, etc. includes a circuit board on which electronic components such an IC chip C, a resistor, etc. are mounted. On the surface of the circuit board 31, a wiring pattern (not shown) and a land serving as a grounding terminal are formed. The IC chip generates noise from itself to have an adverse effect of causing a surrounding electronic component to malfunction, etc.

One example of countermeasure for such a noise problem is to stick a metallic sheet of e.g. copper on an upper surface of the IC chip and connect the metallic sheet to the land 32 serving as a grounding terminal for the circuit board 31 by e.g. soldering. Otherwise, a conductive wire connected to the metallic sheet is secured to a terminal for attachment by screws. In this way, the IC chip C is shielded electromagnetically by the metallic sheet so that the noise generated from the IC is suppressed.

However, the operation of sticking the metallic sheet on the IC chip and soldering it is generally carried out manually. This takes a long time for this operation and is problematic in the working efficiency. Further, the manual operation gives rise to a fear of causing e.g. peeling off of a sheet. Accordingly, the conventional noise sheet is not excellent in quality.

SUMMARY OF THE INVENTION

This invention has been accomplished under the above circumstance.

An object of this invention is to provide a noise protection sheet which can effectively solve a noise problem in an electronic component.

Another object of this invention is to provide an apparatus for mounting such a noise protection sheet.

Still another object of this invention is to provide a method of mounting such a noise protection sheet.

In order to attain the above object, the following techniques are proposed.

In accordance with the first aspect of this invention, there is provided a noise protection sheet stuck on electronic components loaded on a circuit board to control the noise generated from the electronic components, comprising: a metallic sheet, and insulating films which sandwiches the metallic sheet from both front and rear surfaces thereof, wherein the metallic sheet has, at its one end, an extending portion to be connected to a grounding terminal for the circuit board.

Concretely, the other area of the metallic sheet than the extending portion is covered with the insulating films and the extending portion thereof is externally exposed.

In accordance with the noise protection sheet according to this invention, the metallic sheet is sandwiched between the insulating films. The noise protection sheet is stuck onto the upper surface of e.g. an electronic component. The extending portion formed at the one end of the metallic sheet is connected to the grounding terminal for the circuit board. For this reason, while the insulating films keep insulation from the electronic component, the entire metallic sheet can be surely communicated with the grounding terminal through the extending portion so that an excellent shielding effect can be shown. This suppresses the adverse effect of the electronic component to the environment. Further, the sheet, which is metallic, has certain rigidity so that it can be easily handled by a working machine. For this reason, the mounting operation of the noise protection sheet on the electronic component can be automated. This improves the efficiency of the mounting operation.

In another preferred embodiment, the extending portion has a through-hole from which a solder fillet formed on the land elutes when the extending potion is soldered on the land. Therefore, if the extending portion is pressed from above by a head of e.g. a pulse heater, the solder fillet melts and elutes through the through-hole. As a result, the extending portion can be soldered to the grounding terminal. In this way, the soldering operation using the pulse heater can be automated, and assured, thereby improving the quality of the noise protection sheet.

In still another preferred embodiment, the extending portion is bent so as to fit the shape of the electronic component when it is stuck on the electronic component. Therefore, the tip of the extending portion is kept substantially in parallel to the surface of the circuit board so that the soldering operation can be more easily carried out than the case where the soldering operation is carried out with the extending portion being pressed down from above.

In accordance with the second aspect of this invention, there is provided an apparatus for mounting an noise protection sheet on an electronic component loaded on a circuit board, the noise protection sheet with a metallic sheet sandwiched by insulating films from its both front and rear surfaces, comprising:

carrying means for carrying the noise protection sheet held on a carrier tape;

moving means for chucking the noise protection sheet and moving it from the carrier tape onto the electronic component on the circuit board; and soldering means for soldering an extending portion formed at the one end of the metallic sheet to a grounding terminal for the circuit board.

In accordance with the mounting apparatus having the above configuration, where the noise protection sheet is mounted on the electronic component on the circuit board, the noise protection sheet is carried together with the carrier tape, and adsorbed using e.g. an adsorption collet and moved from the carrier tape onto the electronic component on the circuit board. In this state, the extending portion of the metallic sheet is fixed to the grounding terminal for the circuit board. In this case, all the components constituting the mounting apparatus may be existing equipment and operating machines. This permits the noise protection sheet to be automatically mounted on the electronic components without increasing the production cost.

In accordance with the third embodiment of this invention, there is provided a method for mounting an noise protection sheet on an electronic component loaded on a circuit board, the noise protection sheet with a metallic sheet sandwiched by insulating films from its both front and rear surfaces, comprising: a carrying step of carrying the noise protection sheet held on a carrier tape; a moving step of adsorbing the noise protection sheet and moving it from the carrier tape onto the electronic component on the circuit board; and a soldering step of soldering an extending portion formed at the one end of the metallic sheet to a grounding terminal of the circuit board.

This mounting method permits the noise protection sheet provided by the first aspect of this invention to be easily mounted on the electronic component of the circuit board and hence can give a sure solution to the noise problem.

The above and other objects and features of this invention will be more apparent from the following detailed description taken in conjunction with the accompanying drawings.

DESCRIPTION OF THE PREFERRED EMBODIMENTS

Figure 1:
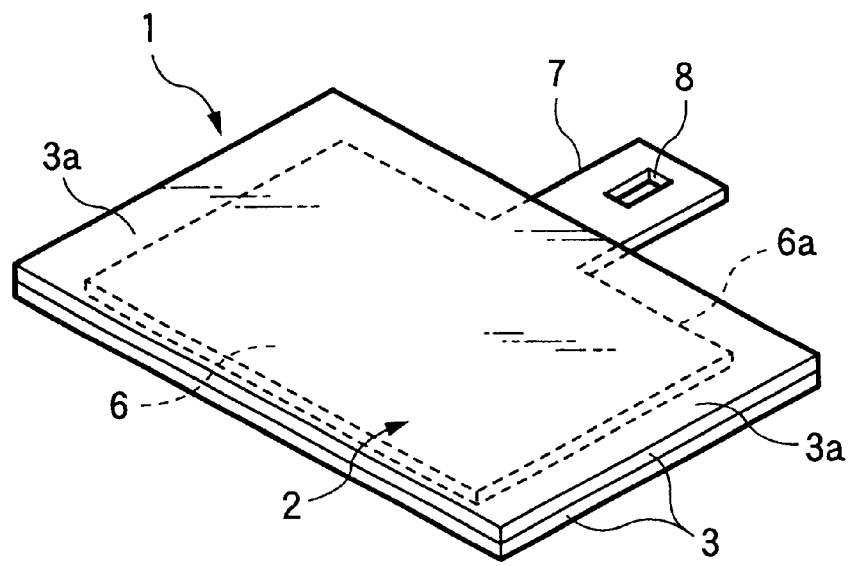
FIG. 1 is a perspective view showing a noise protection sheet according to this invention.

Now referring to the drawings, a concrete explanation will be given of preferred embodiments of this invention.

Figure 2:
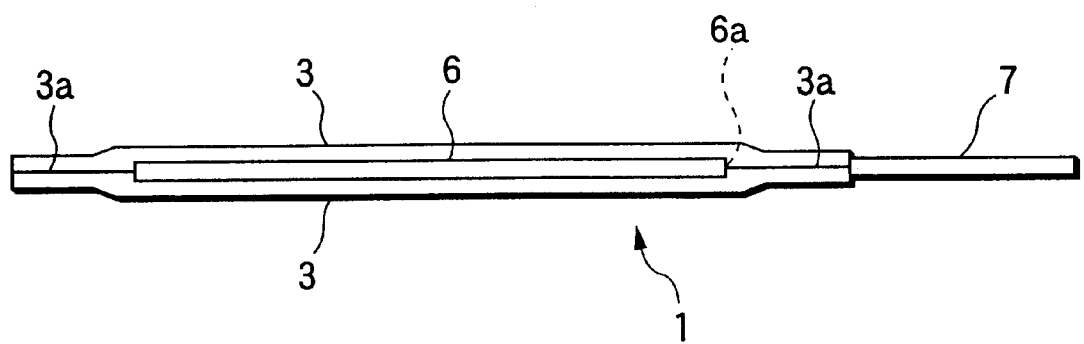
FIG. 2 is a sectional view of the noise protection sheet shown in FIG. 1.
Figure 3:
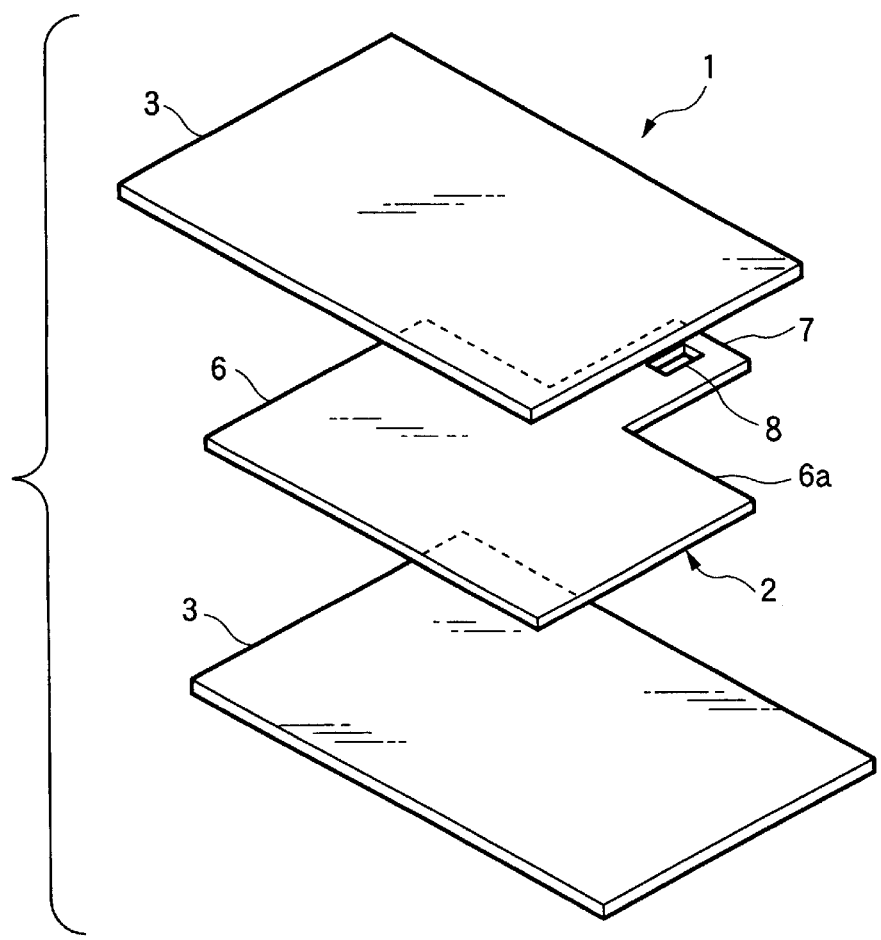
FIG. 3 is an exploded perspective view of the noise protection sheet shown in FIG. 1.

FIG. 1 is a perspective view showing a noise protection sheet according to this invention; FIG. 2 is a sectional view of the noise protection sheet shown in FIG. 1; and FIG. 3 is an exploded perspective view of the noise protection sheet shown in FIG. 1. In the following description, reference will be also made to FIG. 12 as necessary.

Figure 12:
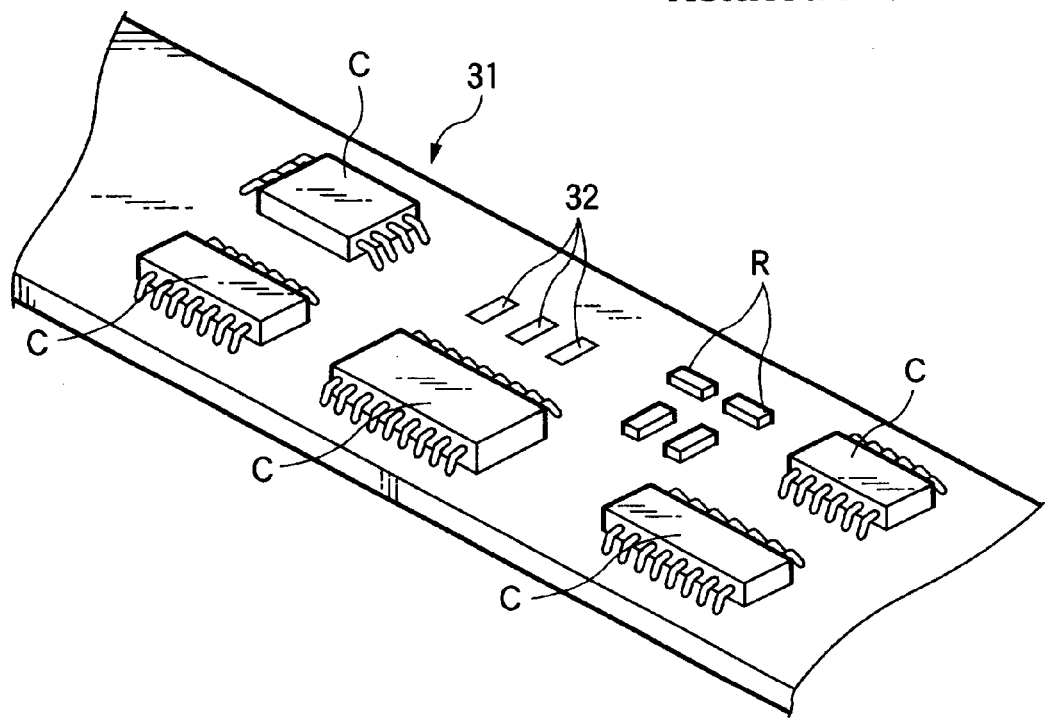
FIG. 12 is a perspective view of a conventional circuit board.

The noise protection sheet is stuck on the IC chip mounted on a circuit board 31 as shown in FIG. 12 and serves to control or suppress the noise generated from the IC chip. The noise protection sheet 1 has a rectangular shape in the entire geometry in which a metallic sheet 2 is sandwiched between thin films 3 from its front and rear surfaces by laminate molding and held integrally to them.

The metallic sheet 2 is made of a conductive film of e.g. a copper foil, and has rigidity enough to be elastically deformable. The metallic sheet 2 is composed of a square portion 6 which is shaped in square and an extending portion 7 which extends outwardly so as to have a prescribed length from a middle position of the one end 6a in a lateral direction. The square portion 6 has a much larger surface area than that of IC chip C on which the noise protection sheet 1 is stuck. Incidentally, the size of the square portion 6 is desired to be adjusted as necessary according to that of the IC chip C which generates noise, thereby showing the shielding effect effectively.

The extending portion 7 is provided for connection to the land 32 serving as a grounding terminal for the circuit board 31. This permits the metallic sheet 2 and grounding terminal to be in a conducting state. The extending portion 7 has a width much larger that of the land 32 on the circuit board 31.

The extending portion 7 has a through-hole 8 from which the solder fillet formed on the land 32 on the circuit board 31 elutes. The through-hole 8 has a width and depth approximately equal to that of the land 32 on the circuit board 31.

The film 3 is formed as a thin film of e.g. polyimide resin or polyethylene terephthalate (PET) having electric insulation. The film 3 has an area slightly larger than that of the square portion 6 of the metallic sheet 2. The metallic sheet 2 is sandwiched from its both front and rear surfaces by the films 3 so that the square portion 6 is not exposed externally and the extending portion 6 is exposed externally by a prescribed length. Namely, the square portion 6 is located at the central position of the films 3 so that it is covered with the films 3. The films 3 are firmly bonded to each other by e.g. an adhesive at the area 3a on the periphery of the square portion 6.

In this way, the noise protection sheet 1 has a structure in which the metallic sheet 2 is sandwiched between the insulating films 3 and the extending portion 7 formed at the one end of the metallic sheet 2 is connected to the land 32 on the circuit board 31. For this reason, the insulating films 3 keep insulation from the electronic component such as IC chip. In addition, since the metallic sheet 2 can be surely communicated with the land 32 serving as the grounding terminal through the extending portion 7, an excellent shielding effect can be shown.

Further, the sheet 2, which is metallic, has certain rigidity so that it can be easily handled by a working machine as described later. For this reason, the mounting operation of the noise protection sheet on the electronic component can be automated. This improves the efficiency of the mounting operation.

Further, the extending portion 7 has the through-hole 8 from which the solder fillet formed on the land 32 elutes. Therefore, when the extending portion 7 is soldered to the land 32, if it is pressed from above by a head of e.g. a pulse heater, the solder fillet 7 melts and elutes through the through-hole 8. As a result, the extending portion 8 can be soldered to the land 32. In this way, the soldering operation using the pulse heater can be automated, and assured, thereby improving the quality of the noise protection sheet. Incidentally, in place of the through-hole 8, a recessed concave portion may be formed at the end of the extending portion 7. Further, the copper surface of the extending portion 7 may be plated with tin to enhance solderbility.

The noise control sheet 1 can be manufactured by the following method.

Figure 4:
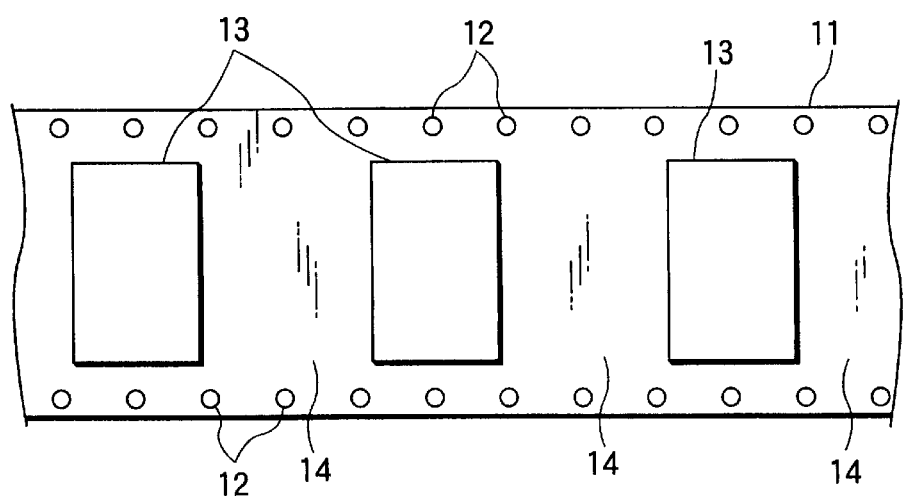
FIGS. 4 to 6 are views for explaining the method of manufacturing a noise protection sheet.

First, as seen from FIG. 4, a first hoop material 11 which is a model of a lower film 3 as shown in FIG. 3 is supplied form a take-up roll (not shown). It should be noted that carriage holes 12 for carrying the hoop material 11 are formed on both sides thereof.

The first hoop material 11 is punched using a prescribed punching blade (not shown) to form a plurality of slits at regular intervals. In this case, each of the remaining areas 14 of the first hoop material 11 between the adjacent slits 13 finally constitutes the film 3. Thereafter, an adhesive or a double-faced tape is applied or stuck on the surface of the first hoop material 11.

Figure 5:
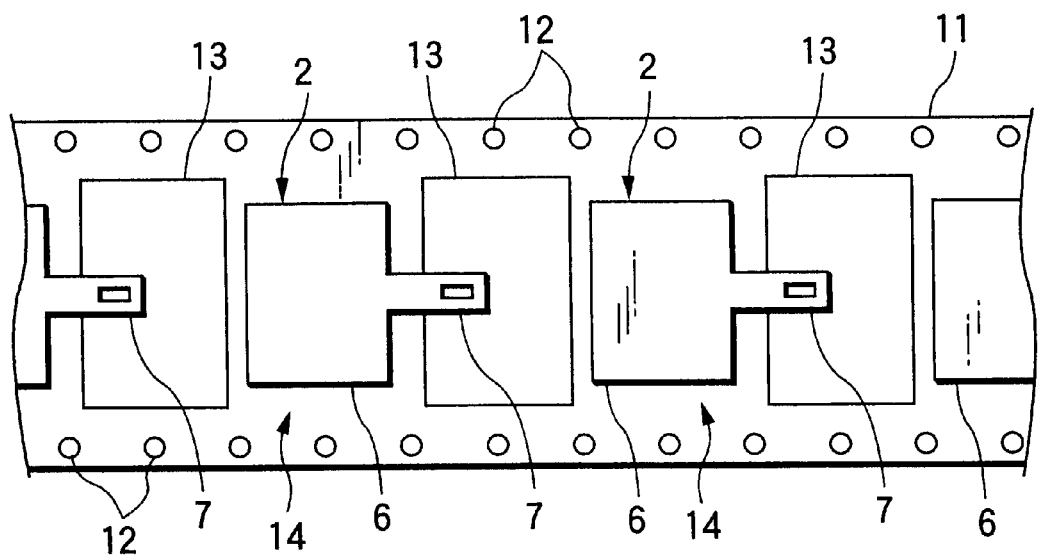

As seen from FIG. 5, a metallic frame made of copper is punched to form metallic sheets 2 each consisting of a square portion and an extending portion 7, and the metallic sheets 2 are placed on the areas 14 with the adhesive applied thereon using a predetermined mounter (not shown), respectively. In this case, each of the metallic sheets 2 is placed so that the extending portion 7 of the metallic sheet 2 is extended into the slit 13 and the square 6 is centrally located on the remaining area 14 of the first hoop material 11.

On the other hand, like the first hoop material 11, a second hoop material 16 which is a model of an upper film 3 is also punched using a prescribed punching blade (not shown) to form a plurality of slits at regular intervals. Thereafter, an adhesive, for example is applied on the surface of the second hoop material 16.

Figure 6:
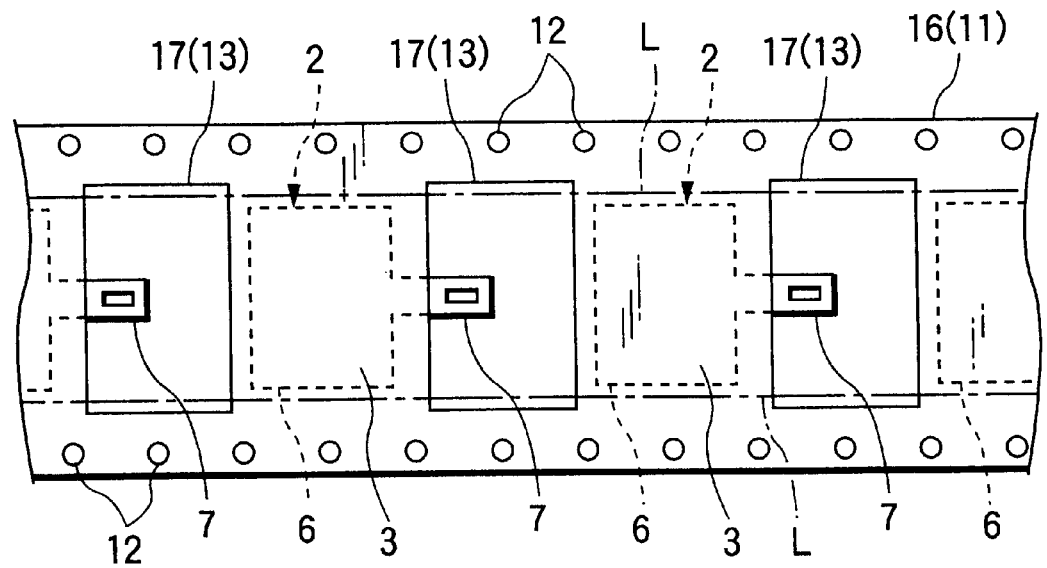

As seen from FIG. 6, the second hoop material 16 is superposed on the first hoop material 11 so that the slits on both hoop materials 11 coincide with each other. Using a predetermined thermal crimping apparatus (not shown), both hoop materials 11 and 16 are bonded in lamination at their portions on which the metallic sheets 2 are placed. Thereafter, both hoop materials 11 and 16 are cut out at their both ends in the longitudinal direction, concretely along one-dot broken lines L indicated in FIG. 6. Thus, discrete components of the noise protection sheets 1 are completed.

The noise protection sheets 1 thus manufactured are mounted on IC chips C on a circuit board 31 as follows. The noise protection sheets 1 are arranged on a carrier tape 21 at regular intervals and carried to the subsequent step with the carrier tape 21. The carrier tape 21 is carried by a roller (not shown). In order to carry the carrier tape 21 in the longitudinal direction, carriage holes 22 for carrying the carrier tape are formed on both sides thereof. In this case, the carrier tape 21 and roller serve as a carrying means.

A double-faced tape (not shown) is stuck on the rear surface of each of the films 3 of the noise protection sheet 1. The double-faced tape holds the noise protection sheet 1 so that it is not misaligned on the carrier tape 21.

Figure 7:
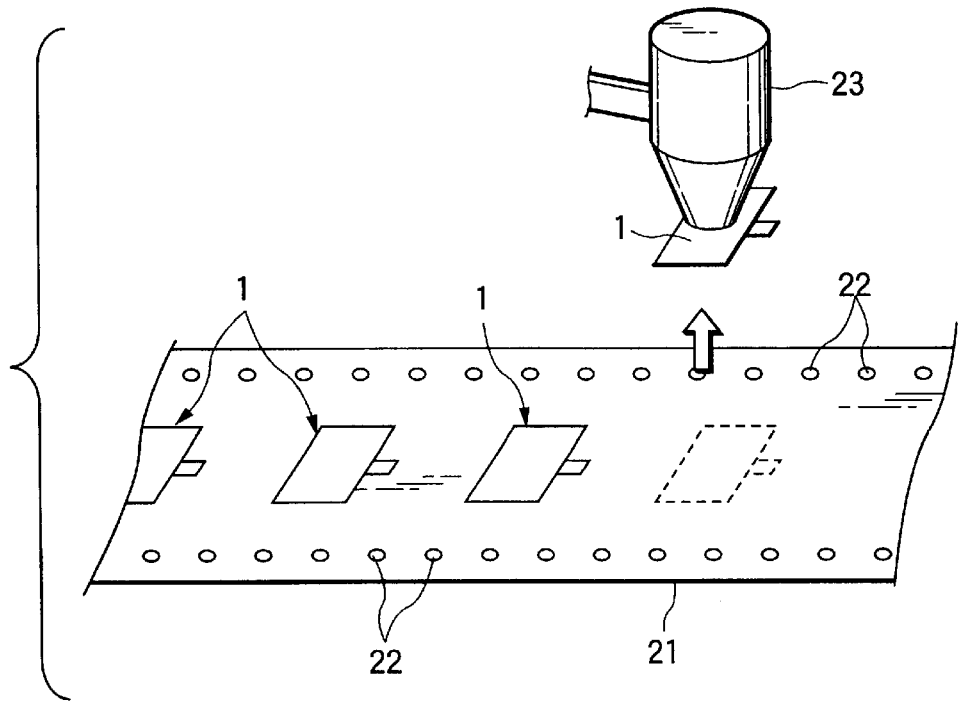
FIGS. 7 to 9 are views for explaining a method of mounting a noise protection sheet on a circuit board.
Figure 8:
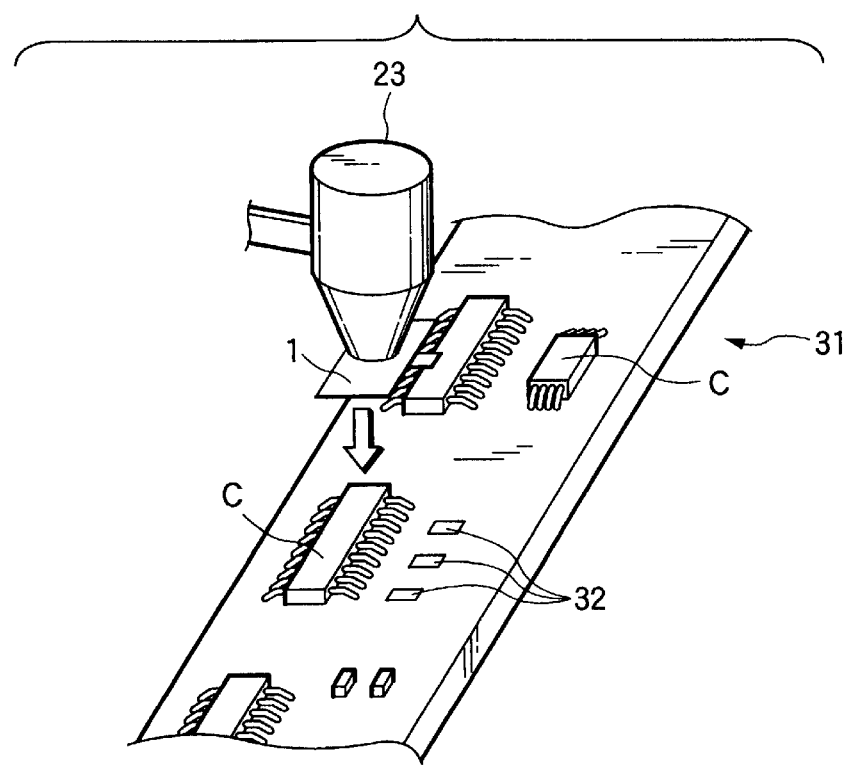

As seen from FIG. 7, the noise protection sheet 1 is adsorbed by an adsorption collet and removed from the carrier tape 21. The noise protection sheet 1 in the state where it has been adsorbed is moved from the carrier tape 21 onto the circuit board 31, and mounted on the IC chip which generates noise. In this case, the noise protection sheet 1 is placed on the IC chip so that the upper surface of the IC chip C is entirely covered with the square portion 6 of the metallic sheet. Since the double-faced tape is stuck on the rear surface of the noise protection sheet 1, the noise protection sheet and the IC chip are firmly bonded to each other. Incidentally, the adsorption collet 23 serves as a moving means.

Figure 9:
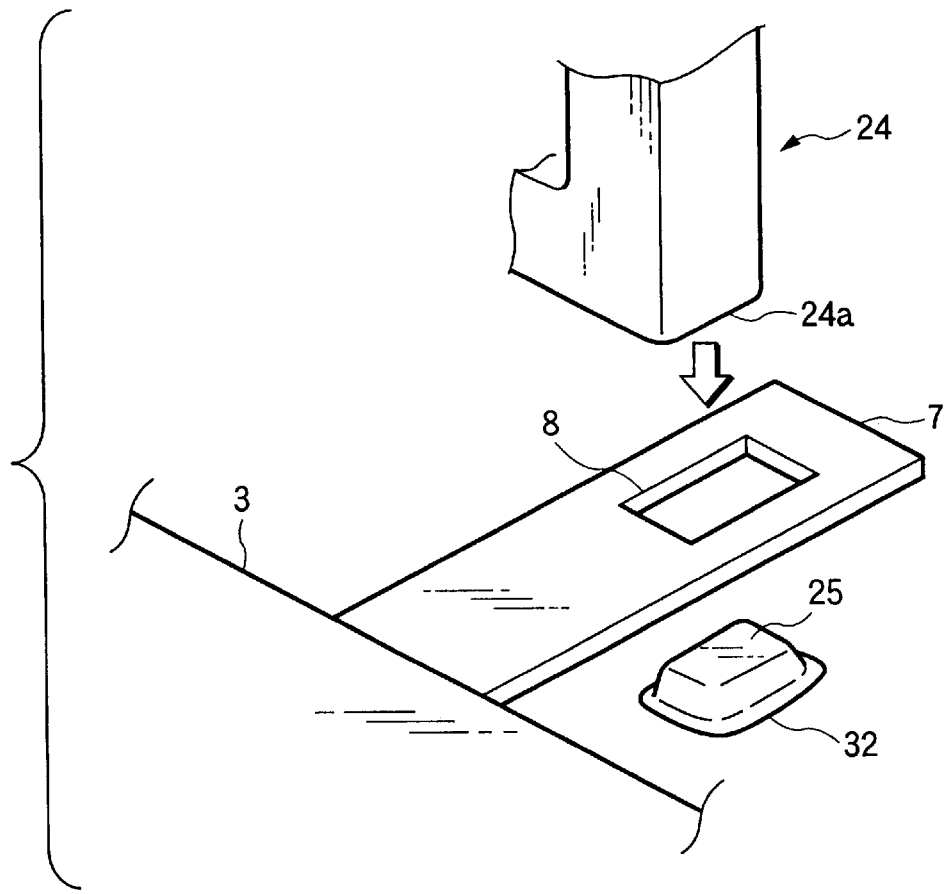

The extending portion 7 of the metallic sheet 2 is soldered to the land 32 of the circuit board 31. Specifically, after the noise protection sheet 1 has been stuck on the upper surface of the IC chip C, as seen from FIGS. 9 and 10, the extending portion 7 is pressed from above by a head 24a of a pulse heater 24 so that it is placed on the land 32 of the circuit board 31. In this state, when heat is supplied from the pulse heater 24, a solder fillet 25 formed on the land 32 melts so that the solder fillet 25 elutes from the through-hole 8 of the extending portion 7 and extends over the surface of the extending portion 7. Thus, the extending portion 7 is bonded to the land 3. In this way, the through-hole 8 of the extending portion 7 permits the extending portion 7 to be satisfactorily bonded to the land 32 serving as the grounding terminal, and contributes to recognize that the solder has been exposed to the surface of the extending portion 7. Incidentally, the pulse heater 24 serves as a soldering means.

Figure 11:
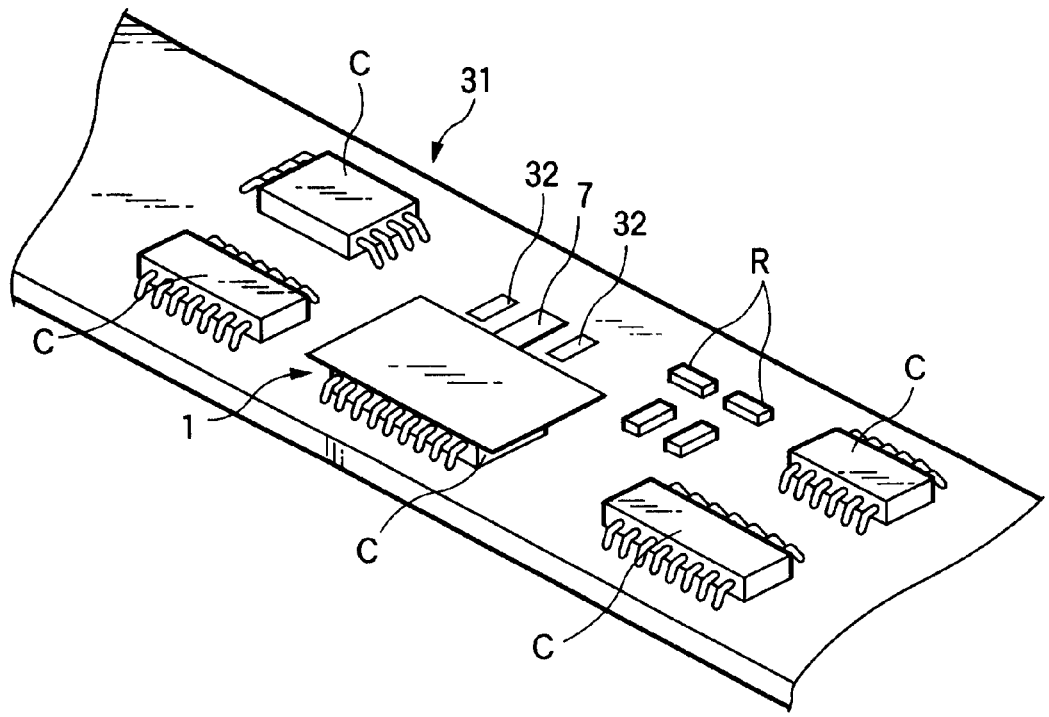
FIG. 11 is a perspective view of the main part of the circuit board on which the noise protection sheet has been mounted.

Accordingly, the noise protection sheet 11 is surely mounted on the IC chip C as seen from FIG. 11. In this case, all the components constituting the mounting apparatus may be existing equipment and operating machines. This permits the noise protection sheet 1 to be automatically mounted on the IC chip without increasing the production cost. Thus, in accordance with this invention, the manufacturing time can be shortened and accurate working can be carried out using the operating machines so that the noise protection sheet 1 can be effectively mounted on the IC chip C.

Additionally, it is preferable that the land 32 is formed in the vicinity of the circuit board 31 which generates noise. Where the land 32 is not located in the vicinity of the IC chip C, the above square portion 6 and extending portion 7 are formed to have suitable lengths so that the extending portion 7 reaches the land 32. In this case, it is preferable that an insulating film is stuck on the lower surface of the extending portion so that the extending portion is not brought into contact with another electronic component. A plurality of extending portions 7 may be formed to extend from the square portion 6.

Figure 10:
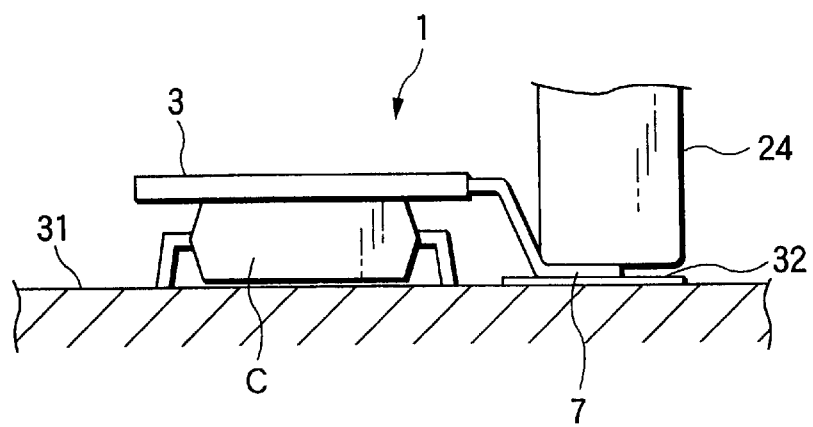
FIG. 10 is a view showing the state where the noise protection sheet has been mounted.

Further, as shown in FIG. 10, the extending portion 7 may be bent previously. In this case, before the metallic sheet 2 is stuck on the first hoop material 11 (see FIG. 4), the extending portion 7 of the metallic sheet 2 is bent so as to fit the shape of e.g. IC chip using a predetermined mold. Therefore, the tip of the extending portion 7 is kept substantially in parallel to the surface of the circuit board so that the soldering operation can be more easily carried out than the case where the soldering is carried out with the extending portion 7 being pressed down from above.

It is needless to say that the scope of this invention should not be limited to the embodiment describe above. For example, the noise protection sheet 1 described in the above embodiment may be applied to noise control in the circuit board incorporated in the electronic appliance such as a camera or video tape recorder.

In the embodiment described above, the noise protection sheet 1 has a structure in which the films 3 are bonded to each other from both front and rear surfaces of the metallic sheet 2. However, the noise protection sheet 1 may have a structure in which the film 3 is stuck on the front surface of the metallic sheet 2 and a double-faced tape is directly stuck on the rear surface of the metallic sheet 2.

What is claimed is:

1. A noise protection sheet stuck on electronic components loaded on a circuit board to suppress noise generated from the electronic components, comprising:

a metallic sheet, and insulating film which sandwich the metallic sheet in-between thereof, wherein said metallic sheet has, at its one end, an extending portion being externally exposed and being connected to a grounding terminal on the circuit board, and said metallic sheet has a first area covered with said insulating films and a second area forming the extending portion.

2. A noise protection sheet according to claim 1, wherein said extending portion has a through-hole through which a solder fillet formed on a land serving as said grounding terminal elutes when said extending potion is soldered on said land.

3. A noise protection sheet according to claim 1, wherein said extending portion is formed in a bent shape so as to fit a shape of at least one of said electronic components when the noise protection sheet is stuck on said electronic components.

4. An apparatus for mounting a noise protection sheet on electronic components loaded on a circuit board, the noise protection sheet comprising a metallic sheet and insulating films sandwiching said metallic sheet in-between, further comprising:

carrying means for carrying said noise protection sheet held on a carrier tape;

moving means for chucking said noise protection sheet and moving it from the carrier tape onto the electronic, components on said circuit board; and soldering means for moldering an extending portion externally exposed and formed at the one end of said metallic sheet to a grounding terminal of said circuit board, wherein said metallic sheet has a first area covered with said insulating films and a second area forming the extending portion.

* * * * *